(12) United States Patent
Heim et al.

(10) Patent No.: US 6,314,117 B1
(45) Date of Patent: Nov. 6, 2001

(54) LASER DIODE PACKAGE

(75) Inventors: Peter John Schultz Heim, Washington, DC (US); Gregg Switzer, Bozeman, MT (US); Mario Dagenais, Chevy Chase, MD (US)

(73) Assignee: Quan Photonics, Inc, Jessup, MD (US)

( * ) Notice: Subject to any disclaimer, the term of this patent is extended or adjusted under 35 U.S.C. 154(b) by 0 days.

(21) Appl. No.: 09/461,183

(22) Filed: Dec. 14, 1999

Related U.S. Application Data

(60) Provisional application No. 60/112,430, filed on Dec. 16, 1998.

(51) Int. Cl.[7] .............. H01S 5/00; H01L 23/02; H01L 31/0203
(52) U.S. Cl. .......... 372/43; 257/680; 257/433; 257/434
(58) Field of Search ............ 372/43; 257/678, 257/680, 433, 434; 359/513

(56) References Cited

U.S. PATENT DOCUMENTS 5,550,675 * 8/1996 Komatsu ............. 359/514
5,615,052 * 3/1997 Doggett ............. 359/811

* cited by examiner

Primary Examiner—Teresa M. Arroyo
Assistant Examiner—James Menefee
(74) Attorney, Agent, or Firm—H. C. Lin

(57) ABSTRACT

The output optical beam from an angled-facet semiconductor laser diode is made to propagate parallel to the optical axis of the laser package with low optical back-reflection. In this way, the angled-facet devices are made compatible with conventional semiconductor laser packages enabling them to be economically incorporated in a wide-range of external semiconductor lasers and amplified spontaneous emission sources. The parallel beam is achieved by tilting the laser diode with respect to the front and back surfaces of the package.

14 Claims, 5 Drawing Sheets

Light Out

LASER DIODE PACKAGE

This application claims priority from provisional application No. 60/112,430 filed Dec. 16, 1998.

BACKGROUND OF THE INVENTION (1). Field of the Invention

This invention relates to manufacturing of opto-electronic devices, and in particular angled-facet semiconductor laser packages and sub-assemblies for use in external cavity lasers and amplified spontaneous emission (ASE) sources.

(2). Description of the Related Art

The manufacture of external cavity lasers and ASE sources based on semiconductor laser diodes requires that anti-reflection coatings be applied to the semiconductor laser diode so that the optical reflection from one or more of the laser diode facets is substantially reduced.

By reducing the reflection from one facet, an external cavity semiconductor laser is formed by introducing spectrally controlled reflection from an external element such as a diffraction grating. A laser cavity is formed between the external reflecting element and the back facet of the laser diode. With appropriate design of the cavity, broadly tunable narrow-linewidth lasers can be implemented as described in U.S. Pat. No. 5,050,179.

In the case of an ASE source, anti-reflection coatings are typically applied to both semiconductor laser facets to eliminate the formation of a laser cavity. With appropriate design of the semiconductor laser device, broad spectral bandwidth ASE sources (super-luminescent laser diodes) can be implemented.

It has been demonstrated that orienting the semiconductor laser waveguide at an angle with respect to the laser facet is an effective technique to reduce the effective facet reflectivity without requiring anti-reflection coatings. This is desirable because extremely high-precision anti-reflection coatings with optical power reflectivity of less than 0.1% are required for most external cavity and ASE source applications. This is difficult to achieve in large-scale manufacturing and adds significantly to the cost and reliability of external cavity lasers and ASE sources based on semiconductor laser diodes. Angled-facet semiconductor lasers have been used to implement both external cavity lasers using a curved-waveguide single-angled-facet structure as explained by P. J. S. Heim et al in "Single-facet diode for widely tunable external cavity semiconductor lasers with high spectral purity", *Electronics Letters*, Jul. 31, 1997, Vol. 33, No. 16 and ASE sources (super-luminescent diodes) using an angled stripe structure as described in U.S. Pat. No. 4,856,014.

One difficulty with angled-facet devices is that the optical beam enters and exits the device at an angle relative to the facet surface normal. In most optical systems it is desirable to define a fixed optical axis that is perpendicular to an established reference plane, i.e. a surface of the laser diode package. The angled-facet device introduces an arbitrary oblique angle that complicates, and thereby discourages, its use in conventional optical systems as exemplified by Heim et al. One application where angled-facet devices have been successfully applied is tilted-stripe angled facet traveling wave semiconductor optical amplifiers, as described by J. V. Collins et al in "Passive alignment of second generation optoelectronic devices", *Selected Topics in Quantum Electronics*, Vol. 3, No. 6, 1997. However, in these applications custom sub-assemblies are developed to accommodate the angled facet in order to implement a self-contained optical fiber-coupled module. It would be highly desirable to supply the angled-facet semiconductor device so that it is compatible with standard laser diode packages as shown in U.S. Pat. No. 5,262,675 and can therefore be directly incorporated into existing optical systems without having to change the design of the optical system.

A conventional semiconductor laser package is shown in FIG. 1. It comprises a semiconductor laser chip 30 that has been soldered to a sub-mount pedestal 20. The submount pedestal is attached to the header base 10 and electrically connected to contact pin 12. A photodiode 70 mounted on the front surface of the header base 18 detects the optical signal 42 emitted from the back facet 33 of the semiconductor laser. Electrical connections to the semiconductor laser chip 13 and photodiode 11 are provided via bond wires 50 and 51, respectively. The semiconductor laser optical waveguide 31 is oriented perpendicular to the front facet 32 and back facet 33 of the semiconductor laser so that the front optical beam 40 and back optical beam 42 are emitted perpendicular to the respective facets. The semiconductor laser chip is attached to the sub-mount pedestal 20 with front facet 32 parallel to the front edge of the sub-mount pedestal 21, which is also parallel with the front surface of the header base 18, so that both front and back semiconductor laser optical beams propagate parallel to the sub-assembly optical axis 15. The output light beam 40 from the sub-assembly emerges through a glass window 62 that has been anti-reflection coated with films 61 and 63 to reduce optical loss. The window 62 is attached to a cap structure 60 that is welded to the header base 10 in a hermetic sealing process.

The entire package shown in FIG. 1 comprised of the header 10, with mounted semiconductor laser 30, and attached window cap 60 is often called a "TO-can" package. This highly successful semiconductor laser package can be found, for example, in every manufactured compact disk player, laser pointer, and semiconductor laser bar-code scanner. The primary features of this package is that the optical beam is emitted parallel to the optical axis of the package which is in a well-defined direction perpendicular to the plane of the header base 10. The position of the optical beam is axially centered on the header base to facilitate positioning and alignment of the beam. The window cap 60 also provides physical protection to the semiconductor laser and enables the entire assembly to be hermetically sealed.

However, the assembly shown in FIG. 1 has the drawback that the light beam propagates in a direction perpendicular to the window 60, causing light reflecting from the window to couple back into the optical waveguide 31. This is particularly undesirable for external cavity laser and ASE source application because the back-reflections set up a parasitic laser cavity which degrades the performance of the device. To avoid reflection, anti-reflection coatings 61 and 63 are used, but expensive and not efficient. When an angled-facet laser diode is used, it is difficult to have the optical signal emitted from the back facet 33 for the photo-sensor 70 to be parallel to the light emitting from the front window 62. Also, for many external cavity laser applications it is advantageous to include a polarization plate in front of the semiconductor laser to improve laser performance as described by H. Lotem et al in "Tunable external cavity diode laser that incorporates a polarization half-wave plate" *Applied Optics*, vol. 31, 1992. Even though the laser performance could be substantially improved, it is often difficult or expensive to insert a polarization plate in existing or planned external cavity laser optical systems since it require extra space.

SUMMARY OF THE INVENTION

An object of this invention is to package an angle-facet laser diode to reduce the back reflection. Another object of this invention is to package an angled-facet laser diode in such a way that the optical beam enters and exits along the conventional optical axis of the sub-assembly. Another object of the present invention is to incorporate economically an angled-facet laser in a conventional semiconductor device package. Still another objective of this invention is to efficiently incorporate a polarization plate into a conventional semiconductor device package.

These objects are achieved by tilting an angled-facet laser in a conventional semiconductor device package, so that the optical beam enters and exits along the conventional optical axis of the package. These objects are further achieved by tilting the window of a conventional semiconductor device to eliminate back reflection and replacing the window with a polarization plate.

DETAILED DESCRIPTION OF THE INVENTION

Figure 1:
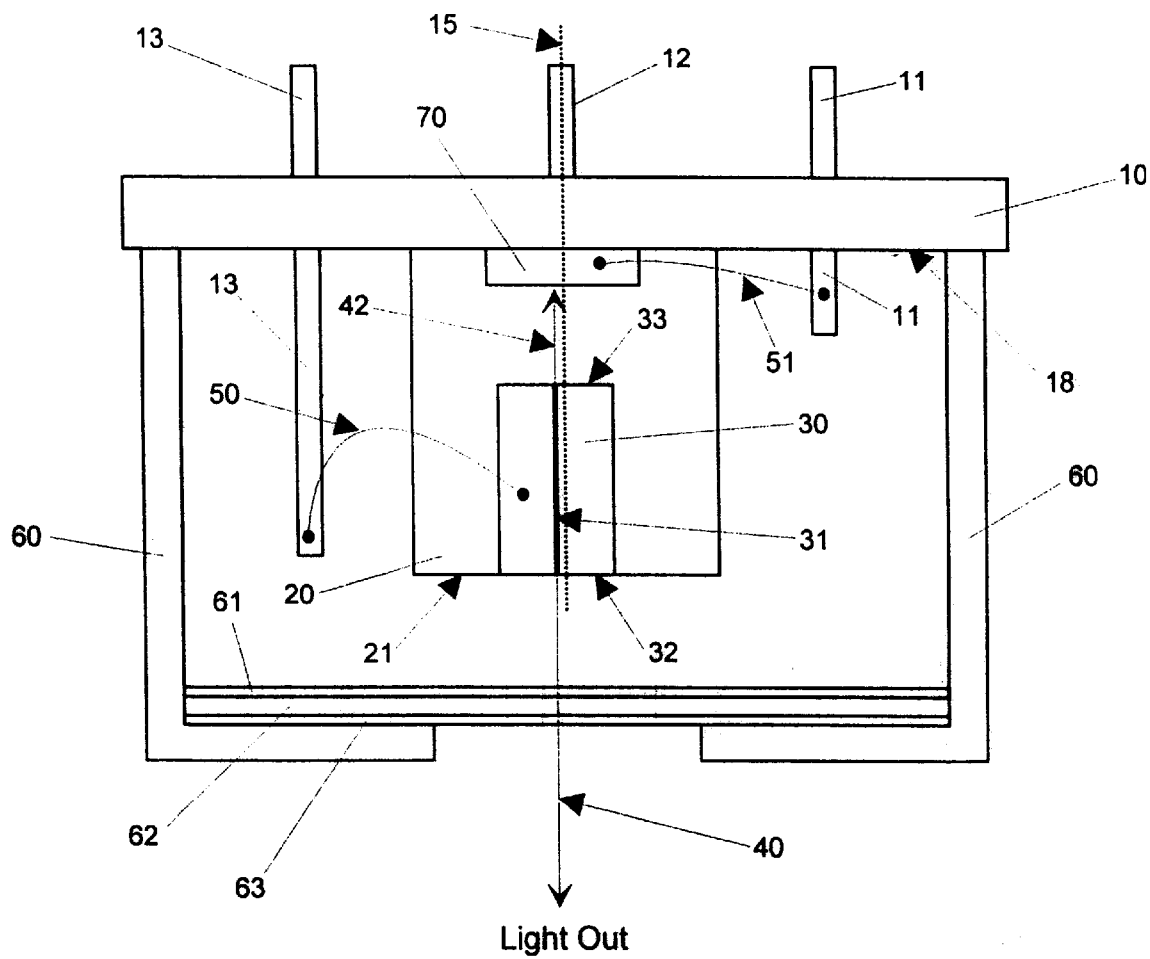
FIG. 1 shows a top view of a conventional semiconductor laser sub-assembly.
Figure 2:
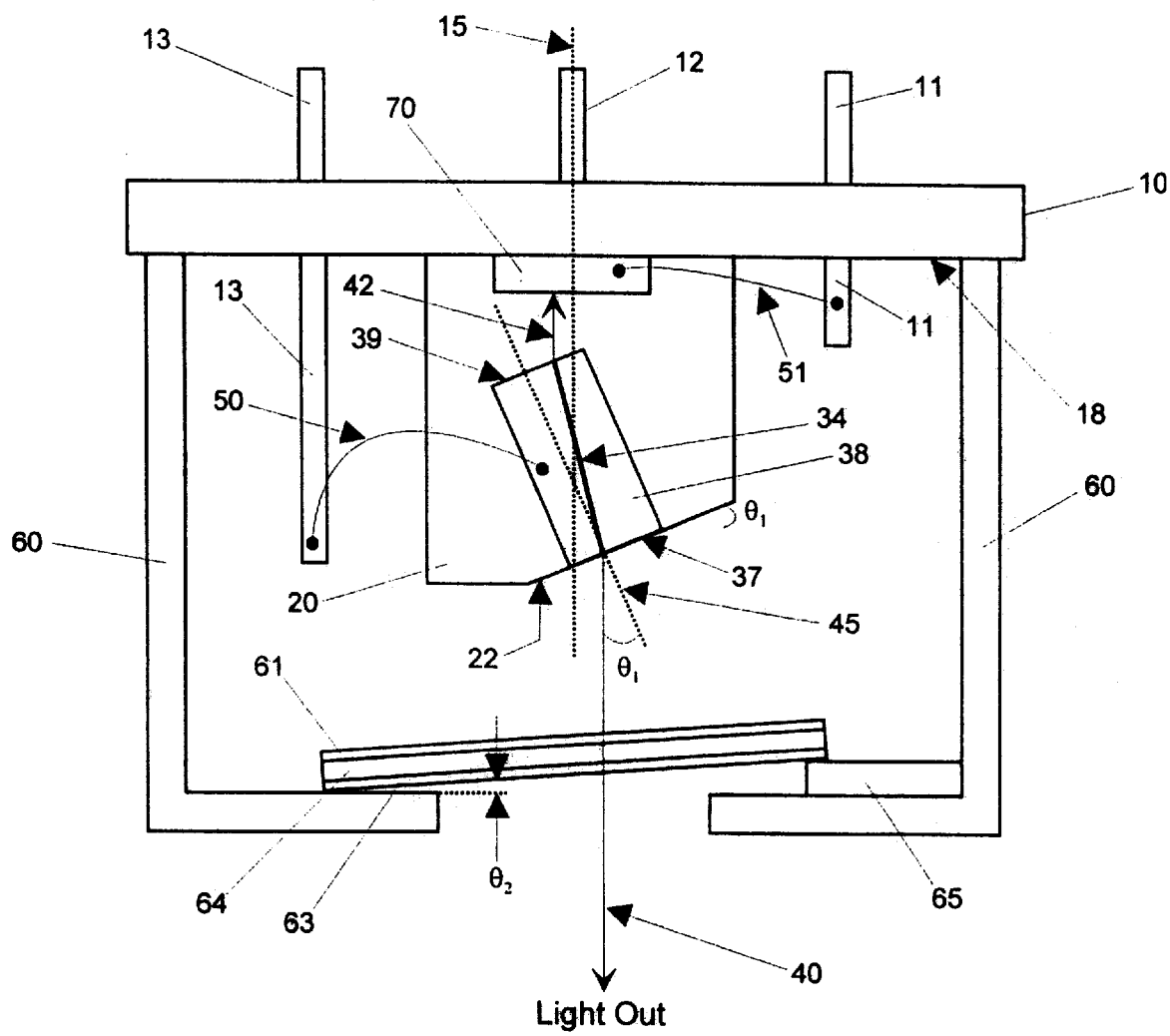
FIG. 2 shows a top view of a tilted-waveguide angled-facet semiconductor optical amplifier sub-assembly of the present invention.

The first embodiment of the invention is shown FIG. 2. It comprises a tilted-waveguide angled-facet semiconductor optical amplifier chip 38 that has been attached to a sub-mount pedestal 20. The sub-mount pedestal is attached to the header base 10 and electrically connected to contact pin 12. A photodiode 70 mounted on the front surface of the header base 18 detects the optical signal 42 emitted from the back facet 39 of the semiconductor laser. Electrical connection 13 to the semiconductor laser chip 38 and connection 11 to the photodiode are provided via bond wires 50 and 51, respectively. The semiconductor optical amplifier waveguide 34 is tilted to intersect the front facet 37 and back facet 39 of the semiconductor device at an oblique angle so that the front optical beam 40 and back optical beam 42 are emitted at an angle $\theta_1$ with respect to the facet surface normal 45. The semiconductor laser chip 38 is attached to the sub-mount pedestal 20 with front facet 37 parallel to the beveled front face of the sub-mount pedestal 22. Surface 22 has been beveled at an angle $\theta_1$ with respect to the front surface of the header base 18 so that both front and back semiconductor laser optical beams 40 and 42 propagate parallel to the sub-assembly optical axis 15. The beveled surface 22 provides clearance so that the path of the light beam 40 is not blocked or diffracted. The output light beam from the sub-assembly emerges through a transparent window 64 that has been anti-reflection coated with films 61 and 63 to reduce optical loss and back-reflection. The transparent window structure 64 can be optical glass or a polarization plate (half-wave, quarter-wave) or other polarizing element. The window is attached to a cap structure 60 with a wedge 65 inserted so that the window is oriented at an angle $\theta_2$ with respect to the front surface of the header base 18. The angle $\theta_2$ is chosen to minimize the optical power reflected back to the semiconductor device. The cap 60 is welded to the header base 10 in a hermetic sealing process.

Figure 3:
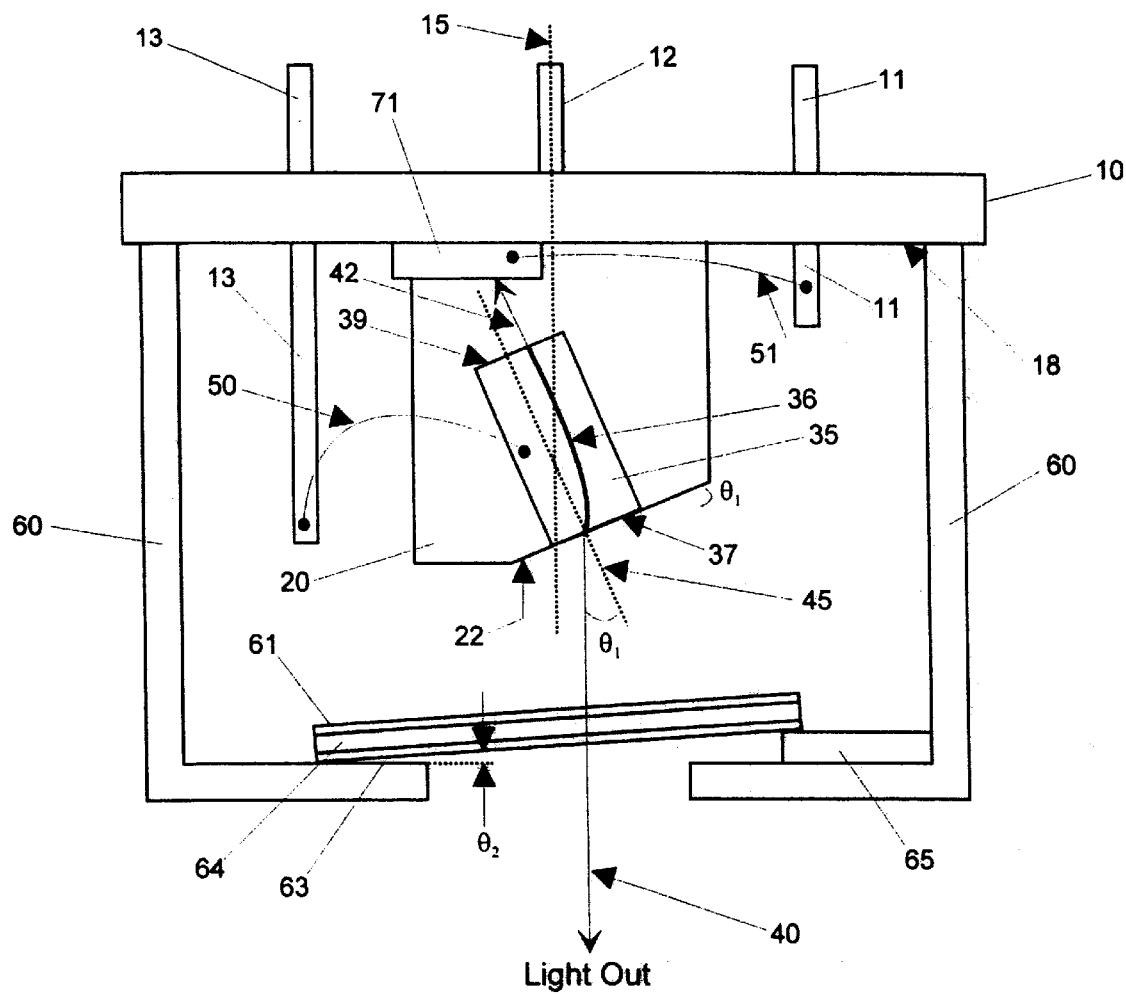
FIG. 3 shows a top view of a curved-waveguide angled-facet semiconductor laser subassembly of the present invention.

The second embodiment of the invention is shown FIG. 3. It comprises a curved-waveguide angled-facet semiconductor laser chip 35 that has been attached to a sub-mount pedestal 20. The sub-mount pedestal is attached to the header base 10 and electrically connected to contact pin 12. A photodiode 71 mounted on the front surface of the header base 18 detects the optical signal 42 emitted from the back facet 39 of the semiconductor laser. Electrical connection 13 to the semiconductor laser chip and connection 11 to the photodiode are provided via bond wires; 50 and 51, respectively. The semiconductor optical waveguide 36 is curved with a constant radius of curvature R given by $R=L/\sin(\phi)$ where L is the length of the curved region and $\phi$ is the desired facet angle. Other sinusoidal or exponential curving functions can be used to define the functional form of the curved region. Arbitrary lengths at the end of the device can be straight or tilted corresponding to an infinite radius of curvature. The curved optical waveguide intersects the back facet 39 at normal incidence (perpendicular) but intersects the front facet 37 at an oblique angle so that the front optical beam 40 is emitted at an angle $\theta_1$ with respect to the facet surface normal 45. The back optical beam 42 is emitted parallel to 45. The semiconductor laser chip is attached to the sub-mount pedestal with front facet 37 parallel to the beveled front face of the sub-mount pedestal 22. Surface 22 has been beveled at an angle $\theta_1$ with respect to the front surface of the header base 18 so that the front semiconductor laser optical beam 40 propagates parallel to the sub-assembly optical axis 15. The beveled surface 22 provides clearance so that the path of the light beam 40 is not blocked or diffracted. The photodiode 71 is mounted on surface 18 to detect the emitted back facet optical beam 42. This beam is incident on the photodiode at an oblique angle enabling the photodiode to be mounted flush against 18 without requiring any additional steps to reduce back-reflections. The output light beam from the sub-assembly 40 emerges through a transparent window 64 that has been anti-reflection coated with films 61 and 63 to reduce optical loss and back-reflection. The transparent window structure 64 can be optical glass or a polarization plate (half-wave, quarter-wave) or other polarizing element. The window is attached to a cap structure 60 with a wedge 65 inserted so that the window is oriented at an angle $\theta_2$ with respect to the front surface of the header base 18. The angle $\theta_2$ is chosen to minimize the optical power reflected back to the semiconductor device 35. The cap 60 is welded to the header base 10 in a hermetic sealing process.

Figure 4:
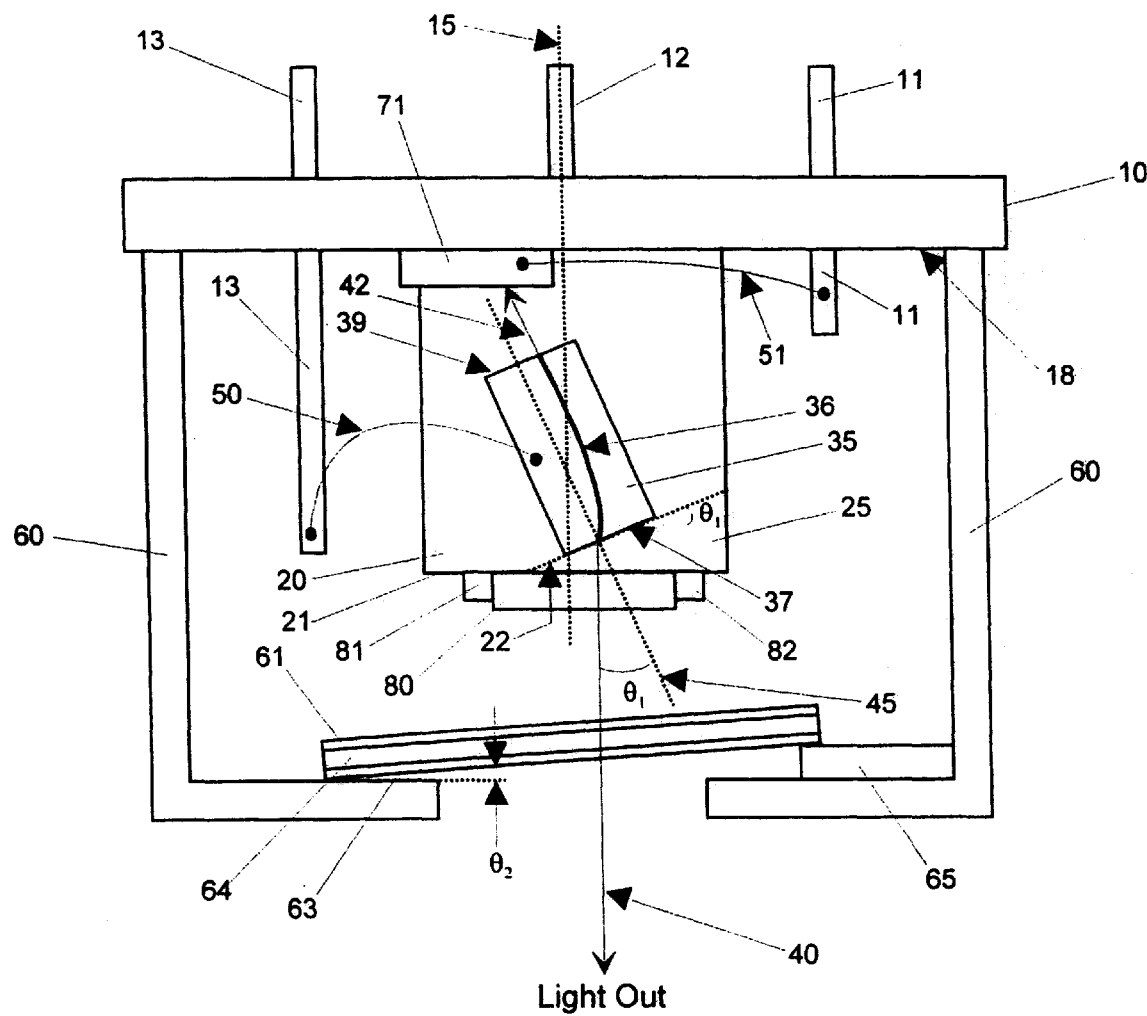
FIG. 4 shows a top view of another embodiment of the curved-waveguide angled-facet semiconductor laser sub-assembly.

The third embodiment of the invention is shown FIG. 4. It consists of a curved-waveguide angled-facet semiconductor laser chip 35 that has been attached to a sub-mount pedestal 20. The sub-mount pedestal is attached to the header base 10 and electrically connected to contact pin 12. A photodiode 71 mounted on the front surface of the header base 18 detects the optical signal 42 emitted from the back facet 39 of the semiconductor laser 35. Electrical connections to the semiconductor laser chip 13 and photodiode 11 are provided via bond wires 50 and 51, respectively. The semiconductor optical waveguide 36 is curved with a constant radius of curvature R given by $R=L/\sin(\phi)$ where L is the length of the curved region and $\phi$ is the desired facet angle. Other sinusoidal or exponential curving functions can be used to define the functional form of the curved region.

Arbitrary lengths at the end of the device can be straight or tilted corresponding to an infinite radius of curvature. The curved optical waveguide intersects the back facet 39 at normal incidence (perpendicular) but intersects the front facet 37 at an oblique angle so that the front optical beam 40 is emitted at an angle $\theta_1$ with respect to the facet surface normal 45. The back optical beam 42 is emitted parallel to 45. The semiconductor laser chip is attached to the sub-mount pedestal with front facet 37 parallel to edge 22. Edge 22 is oriented at an angle $\theta_1$ with respect to the front surface of the header base 18 so that the front semiconductor laser optical beam 40 propagates parallel to the sub-assembly optical axis 15. Edge 22 is formed by a mechanical or chemical machining process that creates a recessed plane area 25 providing clearance so that the path of the light beam 40 is not blocked or diffracted. An optical element 80 is attached to the front surface 21 of the sub-mount pedestal 20 with attaching mechanisms 81 and 82. The optical element 80 can be a refractive, diffractive, or holographic lens placed in close proximity to the angled facet to manipulate the beam shape and/or quality. The photodiode 71 is mounted on surface 18 to detect the emitted back facet optical beam 42. This beam is incident on the photodiode at an oblique angle enabling the photodiode to be mounted flush against 18 without requiring any additional steps to reduce back-reflections. The output light beam from the sub-assembly 40 emerges through a transparent window 64 that has been anti-reflection coated with films 61 and 63 to reduce optical loss and back-reflection. The transparent window structure 64 can be optical glass or a polarization plate (half-wave, quarter-wave) or other polarizing element. The window is attached to a cap structure 60 with a wedge 65 inserted so that the window is oriented at an angle $\theta_2$ with respect to the front surface of the header base 18. The angle $\theta_2$ is chosen to minimize the optical power reflected back to the semiconductor device. The cap 60 is welded to the header base 10 in a hermetic sealing process.

Figure 5:
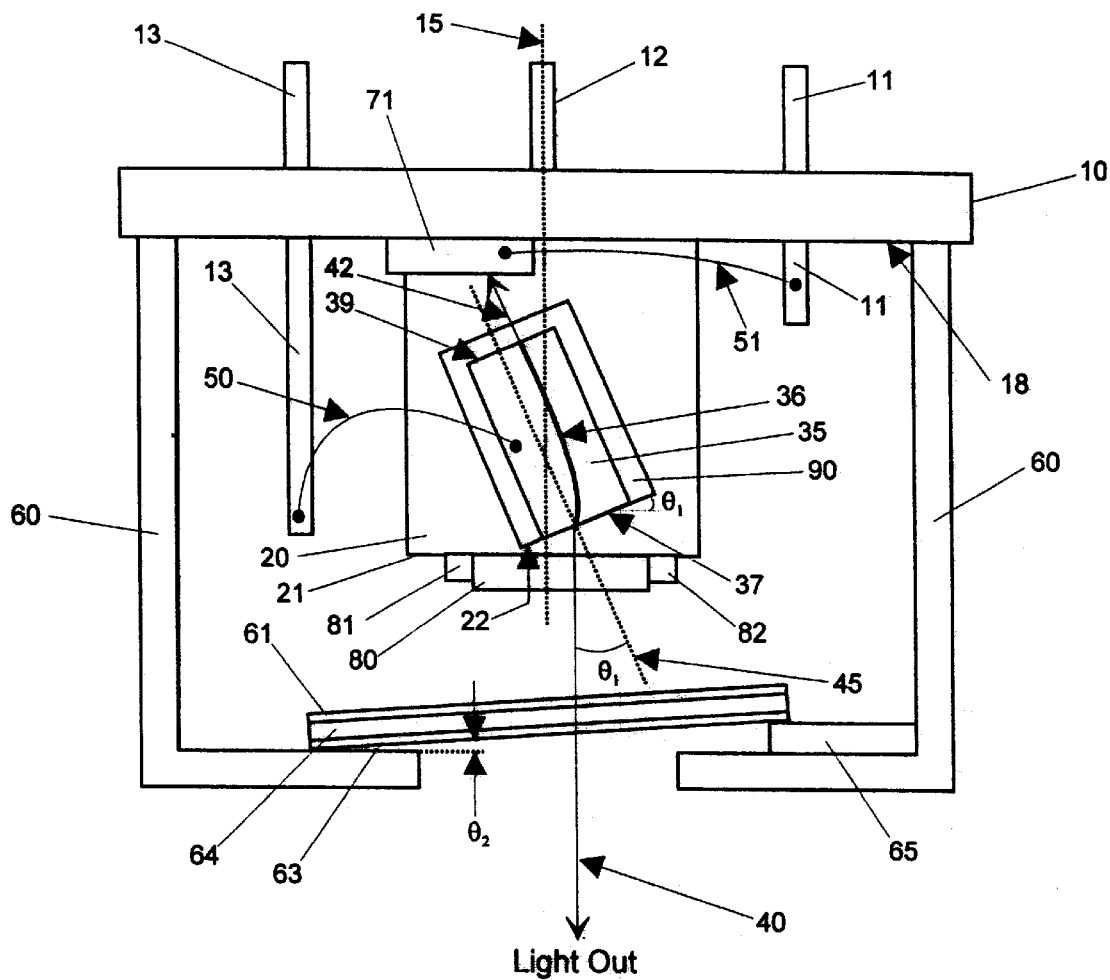
FIG. 5 shows a top view of a third embodiment of the curved-waveguide angle-facet semiconductor laser sub-assembly.

The fourth embodiment of the invention is shown FIG. 5. It comprises a curved-waveguide angled-facet semiconductor laser chip 35 that has been attached to sub-mount 90. The sub-mount 90 is attached to the sub-mount pedestal 20. The sub-mount pedestal is attached to the header base 10 and electrically connected to contact pin 12. A photodiode 71 mounted on the front surface of the header base 18 detects the optical signal 42 emitted from the back facet 39 of the semiconductor laser. Electrical connections to the semiconductor laser chip 13 and photodiode 11 are provided via bond wires 50 and 51, respectively. The semiconductor optical waveguide 36 is curved with a constant radius of curvature R given by $R=L/\sin(\phi)$ where L is the length of the curved region and $\phi$ is the desired facet angle. Other sinusoidal or exponential curving functions can be used to define the functional form of the curved region. Arbitrary lengths at the end of the device can be straight or tilted corresponding to an infinite radius of curvature. The curved optical waveguide intersects the back facet 39 at normal incidence (perpendicular) but intersects the front facet 37 at an oblique angle so that the front optical beam 40 is emitted at an angle $\theta_1$ with respect to the facet surface normal 45. The back optical beam 42 is emitted parallel to 45. The semiconductor laser chip is attached to the sub-mount 90 with front facet 37 parallel to the front edge 22 of the sub-mount 90. The sub-mount 90 is comprised of a material having desirable thermal and mechanical properties, such as aluminum nitride (AlN), diamond, or other material. This sub-mount can be either of the same material as the sub-mount pedestal 21) or of a different material. The sub-mount 90 is attached to the sub-mount pedestal 20 with the front edge 22 oriented at an angle $\theta_1$ with respect to the front surface of the header base 18 so that the front semiconductor laser optical beam 40 propagates parallel to the sub-assembly optical axis 15. The thickness of the sub-mount 90 is chosen to insure adequate clearance so that the path of the light beam 40 is not blocked or diffracted. An optical element 80 is attached to the front surface 21 of the sub-mount pedestal 20 with attaching mechanisms 81 and 82. The optical element 80 can be a refractive, diffractive, or holographic lens placed in close proximity to the angled facet to manipulate the beam shape and/or quality. The photodiode 71 is mounted on surface 18 to detect the emitted back facet optical beam 42. This beam is incident on the photodiode at an oblique angle enabling the photodiode to be mounted flush against 18 without requiring any additional steps to reduce back-reflections. The output light beam from the sub-assembly 40 emerges through a transparent window 64 that has been anti-reflection coated wish films 61 and 63 to reduce optical loss and back-reflection. The transparent window structure 64 can be optical glass or a polarization plate (half-wave, quarter-wave) or other polarizing element. The window is attached to a cap structure 60 with a wedge 65 inserted so that the window is oriented at an angle $\theta_2$ with respect to the front surface of the header base 18. The angle $\theta_2$ is chosen to minimize the optical power reflected back to the semiconductor device. The cap 60 is welded to the header base 10 in a hermetic scaling process.

While the foregoing description refers to a conventional TO-can semiconductor package, other kinds of semiconductor packages may also be used.

While particular embodiments of the invention have been described, it will be apparent to those skilled in the art that various modifications may be made in the embodiments without departing from the spirit of the present invention. Such modifications are all within the scope of this invention.

What is claimed is:

1. A semiconductor laser diode package, comprising:
   a can having a front surface and a back surface parallel to each other;
   an angled-faceted laser diode having:
   rectangular top and bottom surfaces, rectangular left and right surfaces, and rectangular front surface and back surface, and an angled-faceted waveguide between said left and right surfaces and normal to said top and bottom surfaces;
   a sub-mount pedestal for mounting said angled-faceted laser diode at an angle oblique to the front surface and back surface of said can; and
   a window in the front surface of said can for light beam emitted from the front surface of said angled-faceted laser diode to pass through; and
   a photo diode mounted at the back of said top surface of said sub-mount pedestal for sensing the light beam emitted from the back surface of said angled-faceted laser diode.

2. A semiconductor laser diode package as described in claim 1, wherein one edge of the sub-mount pedestal is beveled to align with the front surface of said angled-faceted laser diode.

3. A semiconductor laser diode package as described in claim 1, wherein said window is tilted with respect to the front surface of said can.

4. A semiconductor laser diode package as described in claim 3, wherein said window is coated with anti-reflection material.

5. A semiconductor laser diode package as described in claim 3, wherein said window is a polarization half-wave plate.

6. A semiconductor laser diode package as described in claim 3, wherein said window is a polarization quarter-wave plate.

7. A semiconductor laser diode package as described in claim 1, wherein the light emitted from the back surface of the angled-faceted laser diode and the light beam emitted from the front surface of said angled-faceted laser diode are in parallel.

8. A semiconductor laser diode package as described in claim 1, wherein said light emitted from the front surface of said angled-faceted laser diode is perpendicular to the front surface of said can.

9. A semiconductor laser diode package as described in claim 1, wherein the radius of curvature of said waveguide is infinite.

10. A semiconductor laser diode as described in claim 1, wherein the radius of curvature of said waveguide is finite.

11. A semiconductor laser diode package as described in claim 1, further comprising a lens placed in front of said angled-faced laser diode and in parallel with the front surface of said can.

12. A semiconductor laser diode package as described in claim 11, wherein said lens is selected from the group consisting of refractive lens, diffractive lens, and holographic lens.

13. A semiconductor laser package as described in claim 1, wherein said sub-mount pedestal has a recess with a beveled edge which aligns with the front surface of said laser diode.

14. A semiconductor laser diode as described in claim 1, further comprising a sub-mount over said sub-mount pedestal to raise the position of the laser diode with one end aligned with the front facet of the laser diode.

* * * * *